United States Patent [19]
Kanou

[11] Patent Number: 5,603,097
[45] Date of Patent: Feb. 11, 1997

[54] DIGITAL RADIO SYSTEM CAPABLE OF HIGH-SPEED FREQUENCY CHANGING AT LOW POWER CONSUMPTION

[75] Inventor: Hideto Kanou, Tokyo, Japan

[73] Assignee: Kyocera Corporation, Kyoto, Japan

[21] Appl. No.: 517,196

[22] Filed: Aug. 21, 1995

Related U.S. Application Data

[63] Continuation of Ser. No. 181,614, Jan. 13, 1994, abandoned.

[30] Foreign Application Priority Data

Jan. 13, 1993 [JP] Japan .................................... 5-020528

[51] Int. Cl.$^6$ .................................................... H04B 1/50
[52] U.S. Cl. .................. 455/76; 455/86; 455/260; 329/325; 331/22; 332/127
[58] Field of Search ........................ 455/73, 75, 76, 455/82, 83, 84, 86, 260, 265, 119; 329/325, 323; 332/127; 331/22; 375/376, 327

[56] References Cited

U.S. PATENT DOCUMENTS

| | | | |
|---|---|---|---|
| 4,063,173 | 12/1977 | Nelson et al. | 455/119 |
| 4,086,545 | 4/1978 | Teshigori | 331/16 |
| 5,020,093 | 5/1991 | Pireh | 379/59 |
| 5,276,915 | 1/1994 | Marko et al. | 455/86 |

Primary Examiner—Reinhard J. Eisenzopf
Assistant Examiner—Lee Nguyen
Attorney, Agent, or Firm—Loeb & Loeb LLP

[57] ABSTRACT

The output frequency of a PLL frequency synthesizer and the output frequency of a fixed oscillator are mixed together in a mixer to produce sum and difference frequencies. The sum frequency is used as a local frequency, and the difference frequency is fed back to the PLL frequency synthesizer. In addition, the output frequency of the fixed oscillator is divided in a predetermined ratio to use it as a local frequency for the second or other subsequent frequency converting stage on the receiver or transmitter side.

2 Claims, 5 Drawing Sheets

$\tau_1 = CR1$
$\tau_2 = CR2$
$\tau = \tau_1 + \tau_2$

DIGITAL RADIO SYSTEM CAPABLE OF HIGH-SPEED FREQUENCY CHANGING AT LOW POWER CONSUMPTION This is a continuation of application Ser. No. 08/181,614 filed on Jan. 13, 1994, now abandoned.

BACKGROUND OF THE INVENTION

The present invention relates to a radio system which may be used for digital automobile telephones, personal handy phones, etc.

FIG. 1 is a block diagram showing the arrangement of a conventional radio system for digital automobile telephones or the like.

In the radio system arranged as shown in FIG. 1, a signal received through an antenna 1 is separated by an antenna multiplexer 2 and then sent to a radio-frequency amplifier 3 where it is amplified.

The amplified signal is supplied to a band-pass filter 4 where undesired waves are removed, and then down-converted in a mixer 5 with a first local frequency. The converted signal is sent to a band-pass filter 6 of first intermediate frequency where undesired waves are removed to produce a first intermediate-frequency signal, which is then amplified in a first intermediate-frequency amplifier 7.

Further, the first intermediate-frequency signal is down-converted in a mixer 8 with the output frequency of a receiving second local oscillator 13 to produce a second intermediate-frequency signal, which is then supplied to a band-pass filter 9 of second intermediate frequency where undesired waves are removed. Thereafter, the second intermediate-frequency signal is amplified in a second intermediate-frequency amplifier 10, detected in a detector 11, and demodulated in a baseband signal processor 12.

On the other hand, a signal to be transmitted which is generated in the baseband signal processor 12 is quadrature modulated in a quadrature modulator 24 with the frequency of an output signal from a transmitting second local oscillator 23 and then supplied to a band-pass filter 22 where undesired waves are removed.

The signal, which has undesired waves removed therefrom, is up-converted with the first local frequency in a mixer 21 and then supplied to a band-pass filter 20 where undesired waves are removed. Thereafter, the signal is amplified to a normal power level in a power amplifier 19.

The signal, which has been amplified to the normal power level, is supplied to the antenna 1 via the antenna multiplexer 2 and then transmitted.

The conventional radio system, arranged as described above, suffers from the problem that the transmit and receive frequencies are higher than those of analog automobile telephones, cordless telephones, etc., resulting in an increase in the power consumed in a PLL frequency synthesizer 15, a fixed oscillator 18 and other elements, which are used to constitute a local oscillator. The increase in the power consumption is a particularly serious problem in mobile telephones, which use a battery as a power source.

The problem of the conventional radio system will be explained below by way of an example of preset frequencies for digital automobile telephones operating in the 1.5 GHz band.

In communication between a base station and a mobile station, the transmit frequency used at the mobile station is specified as falling in the range of 1,429 to 1,441 MHz or in the range of 1,453 to 1,465 MHz, and the receive frequency in the range of 1,477 to 1,489 MHz or in the range of 1,501 to 1,513 MHz.

Let us take the transmit frequency band of 1,429 to 1,441 MHz and the receive frequency band of 1,477 to 1,489 MHz by way of example for the following explanation. Assuming that the first and second intermediate frequencies are 130 MHz and 450 KHz, respectively, which are common in the 800 MHz band, the first local frequency is 1,607 to 1,619 MHz {(1,477+130) MHz to (1489+130) MHz}, and this is the frequency of the PLL frequency synthesizer 15.

The output frequency of the receiving second oscillator 13 is 129.55 MHz (130 MHz–450 KHz).

In addition, from the relationship between the first local frequency (1,607 to 1,619 MHz) and the transmit frequency (1,429 to 1,441 MHz), the transmitting second local frequency is 178 MHz (1,607–1,429 MHz). The output frequency of the fixed oscillator 18 must approach the frequency of the PLL frequency synthesizer 15. Therefore, if it is determined to be 12 times the receiving second local frequency, the output frequency of the fixed oscillator 18 is 1,554.6 MHz.

SUMMARY OF THE INVENTION

In view of the above-described circumstances, it is an object of the present invention to provide a digital radio system which is free from the above-described problem and capable of high-speed frequency changing at low power consumption.

A gist of the present invention resides in that the output frequency of a PLL frequency synthesizer and the output frequency of a fixed oscillator are mixed together in a mixer to produce sum and difference frequencies, and the sum frequency is used as a local frequency, whereas the difference frequency is fed back to the PLL frequency synthesizer.

The above-described arrangement provides the following advantages: The output frequency of a VCO (Voltage-Controlled Oscillator) in the PLL frequency synthesizer is mixed with a certain fixed frequency to produce a difference frequency, and a phase-locked loop is formed by using the difference frequency. By doing so, there is no change in the frequency modulation sensitivity (frequency change divided by control voltage change) of the VCO, but the input frequency of the PLL frequency synthesizer lowers, and therefore the frequency changing speed increases. In addition, since the sum frequency is used as the first local frequency, it is possible to lower the output frequency of the VCO of the PLL frequency synthesizer and hence possible to achieve a reduction in the power consumption.

Another gist of the present invention resides in that in a radio system wherein each of the transmitter and receiver sides has at least two frequency converting stages, the output frequency of the above-described fixed oscillator is divided in a predetermined ratio to use it as a local frequency for the second or other subsequent frequency converting stage on the receiver or transmitter side.

The above-described arrangement provides the following advantages: In a radio system having at least two frequency converting stages, the output frequency of a VCO in a 1-st local PLL frequency synthesizer is down-converted with a certain fixed frequency to produce a lower frequency, and a phase-locked loop is formed by using this frequency. Consequently, the frequency dividing ratio decreases, although there is no change in the frequency modulation sensitivity of the VCO. Accordingly, the loop gain increases, and as a result, the lock-up time shortens, i.e., the lock-up speed increases.

If the fixed frequency for the down conversion is divided so as to be equal to a local frequency in the second or other subsequent stage, it is possible to eliminate a local oscillator which would otherwise be needed in the second or other subsequent stage. Thus, it is possible to reduce the overall size of the circuit and reduce the power consumption.

DESCRIPTION OF THE PREFERRED EMBODIMENT

Figure 2:
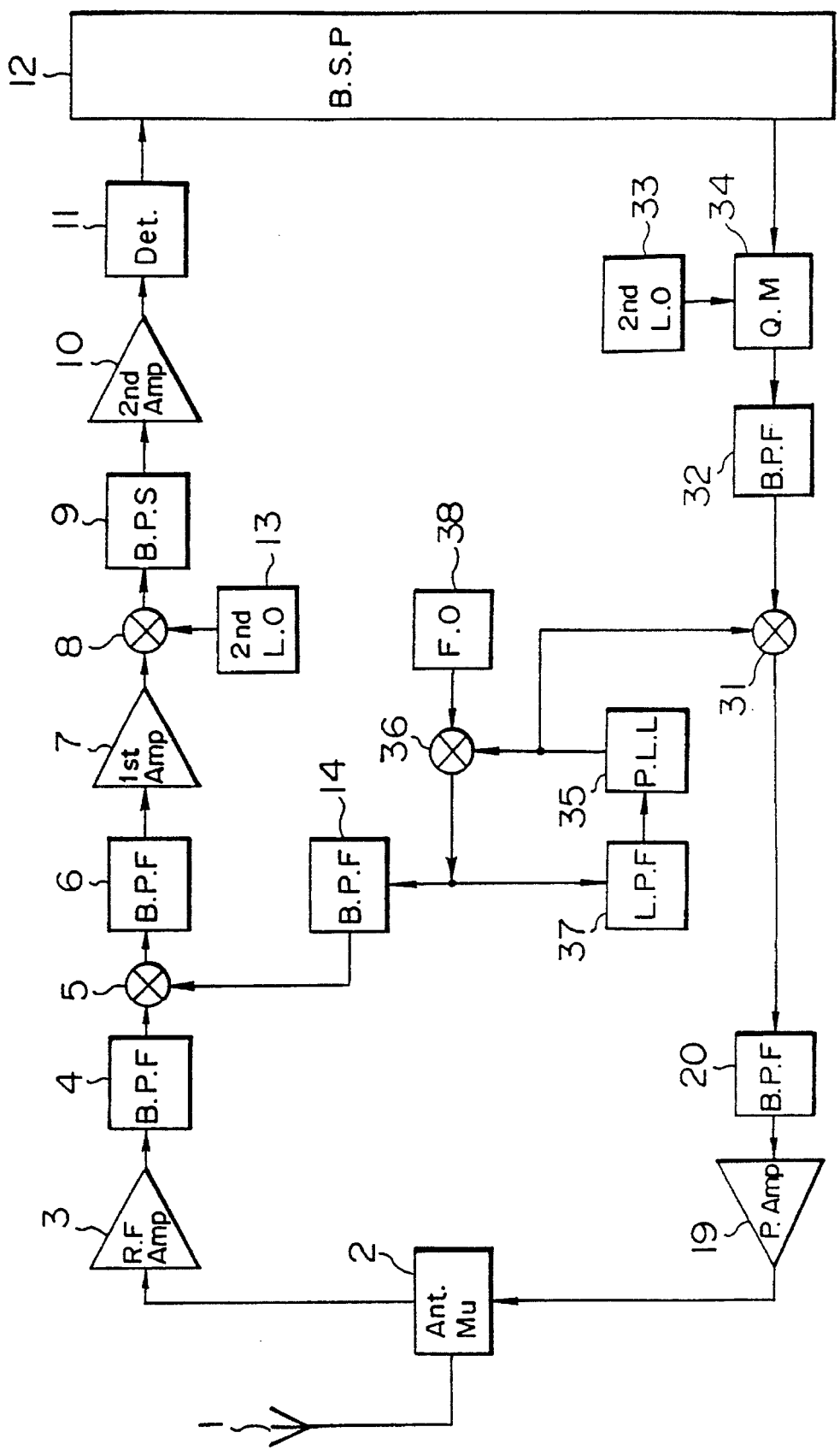
FIG. 2 is a block diagram showing one example of the arrangement of the radio system according to the present invention.

One embodiment of the present invention will be described below with reference to the accompanying drawings. FIG. 2 is a block diagram showing one example of the arrangement of the radio system according to the present invention.

As shown in FIG. 2, the radio system of the present invention includes the following constituent elements: an antenna 1 for signal transmission and reception; an antenna multiplexer 2 (or a duplexer) for using a single antenna 1 for both transmission and reception; a radio-frequency amplifier 3; band-pass filters 4, 6, 9, 14, 20 and 32 for removing undesired waves; mixers 5, 8, 31 and 36 for up-or down-converting a frequency; a first intermediate-frequency amplifier 7; a second-intermediate-frequency amplifier 10; a detector 11; a baseband signal processor 12; a receiving second local oscillator 13; a PLL (Phase-Locked Loop) frequency synthesizer 35 for a first local oscillator; a low-pass filter 37 for removing undesired waves; a fixed oscillator 38 for down-converting the output frequency of the PLL frequency synthesizer 35 to a lower frequency; a power amplifier 19 for amplifying a signal to be transmitted to a normal power level; a transmitting second local oscillator 33; and a quadrature modulator 34 for modulating an output signal from the baseband signal processor 12. In the radio system arranged as described above, a signal received through the antenna 1 is separated by the antenna multiplexer 2 and then sent to the high-frequency amplifier 3 where it is amplified.

The amplified signal is supplied to the band-pass filter 4 where undesired waves are removed, and then down-converted in the mixer 5 with a first local frequency. The converted signal is sent to the band-pass filter 6 of first intermediate frequency where undesired waves are removed to produce a first intermediate-frequency signal, which is then amplified in the first intermediate-frequency amplifier 7.

The first intermediate-frequency signal is down-converted in the mixer 8 with the output frequency of the receiving second local oscillator 13 to produce a second intermediate-frequency signal, which is then supplied to the band-pass filter 9 of second intermediate frequency where undesired waves are removed. Thereafter, the second intermediate-frequency signal is amplified in the second intermediate-frequency amplifier 10, detected in the detector 11, and demodulated in the baseband signal processor 12.

On the other hand, a signal to be transmitted which is generated in the baseband signal processor 12 is quadrature modulated in the quadrature modulator 34 with the frequency of an output signal from the transmitting second local oscillator 33 and then supplied to the band-pass filter 32 where undesired waves are removed.

The signal, which has undesired waves removed therefrom, is up-converted with the first local frequency in the mixer 31 and then supplied to the band-pass filter 20 where undesired waves are removed. Thereafter, the signal is amplified to a normal power level in the power amplifier 19.

If the output frequency of the PLL frequency synthesizer 35 is made equal to a transmitting local frequency for the up conversion, it is possible to eliminate a local oscillator. Thus, it is possible to reduce the overall size of the circuit and reduce the power consumption.

The signal, which has been amplified to the normal power level, is supplied to the antenna 1 via the antenna multiplexer 2 and then transmitted. The above-described operation is the same as that of the conventional radio system shown in FIG. 1.

Figure 1:
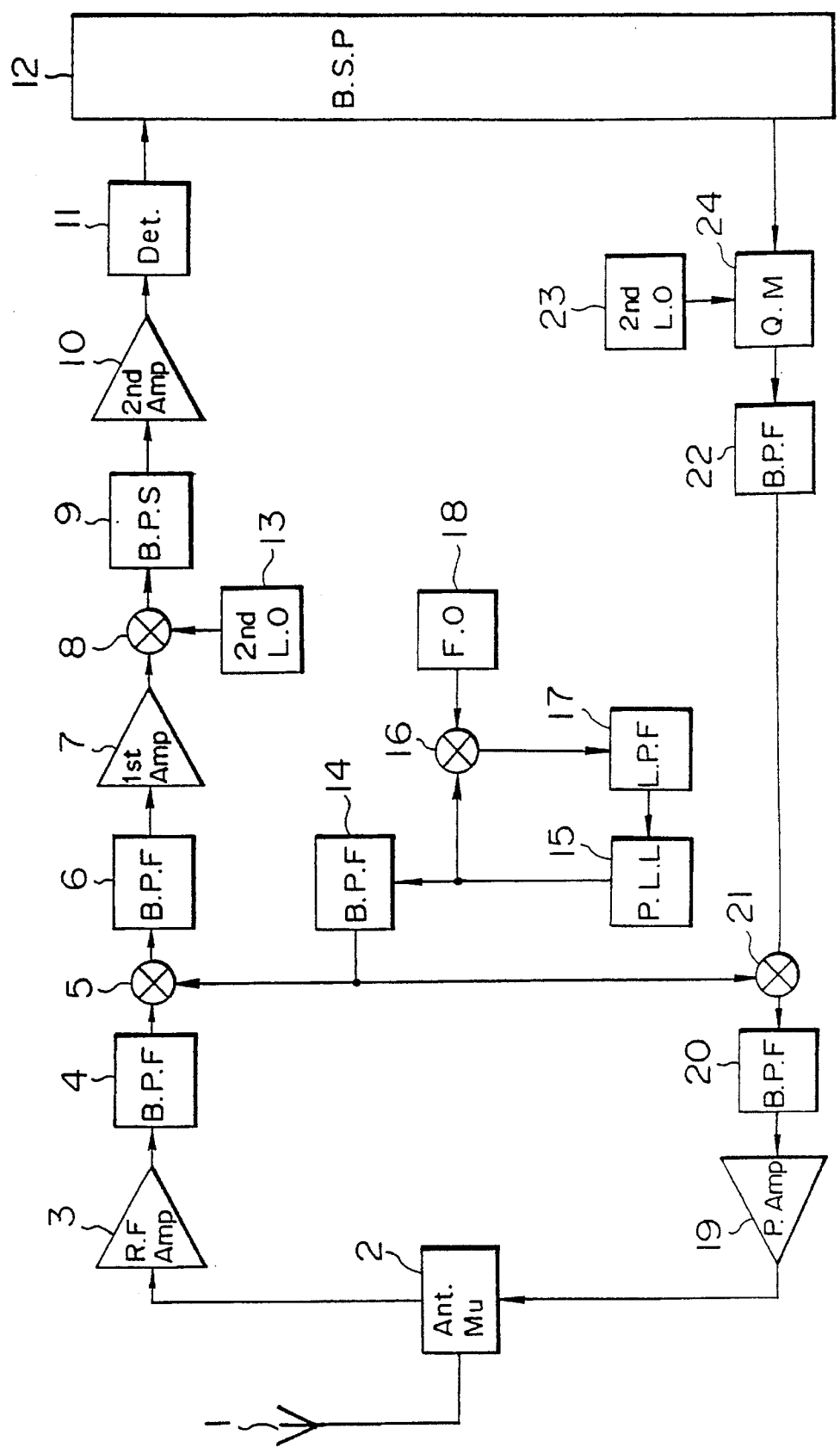
FIG. 1 is a block diagram showing one example of the arrangement of a conventional radio system.

The fixed oscillator 18, the mixer 21, the band-pass filter 22, the transmitting second local oscillator 23 and the quadrature modulator 24 in the radio system shown in FIG. 1 respectively have similar functions to those of the fixed oscillator 38, the mixer 31, the band-pass filter 32, the transmitting second local oscillator 33 and the quadrature modulator 34 in the radio system shown in FIG. 2, but they are different in frequency from each other.

Points in which the radio system of the present invention differs from the conventional radio system shown in FIG. 1 will be explained below. The output frequency of the PLL frequency synthesizer 35 is supplied to the mixer 31 as a transmitting first local frequency and also supplied to the mixer 36.

The mixer 36 mixes the supplied frequency with the output frequency of the fixed oscillator 38 to produce sum and difference frequencies. The sum frequency is taken out through the band-pass filter 14 and supplied to the mixer 5 as a receiving first local frequency.

The difference frequency is taken out through the low-pass filter 37 and fed back to the PLL frequency synthesizer 35.

Accordingly, it is possible to lower the output frequencies of the PLL frequency synthesizer 35 and the fixed oscillator 38 and hence achieve a reduction in the power consumption. In addition, the frequency changing speed increases.

In the case of digital automobile telephones for 1.5 GHz band, the parts for 800 MHz band, which have heretofore been used, can be used, and it is therefore possible to lower the cost and reduce the number of designing steps required.

One example of preset frequencies for 1.5 GHz-band digital automobile telephones according to this embodiment will be shown below.

The transmit frequency band of 1,429 to 1,441 MHz and the receive frequency band of 1,477 to 1,489 MHz will be taken by way of example for the following explanation.

Assuming that the first and second intermediate frequencies are 130 MHz and 450 KHz, respectively, the receiving first local frequency is 1,607 to 1,619 MHz. Accordingly, the PLL frequency synthesizer 35 and the fixed oscillator 38 should be arranged such that the sum of the frequency of the PLL frequency synthesizer 35 and the frequency of the fixed oscillator 38 falls in the range of 1,607 to 1,619 MHz.

The difference between the two frequencies is a signal that is fed back to the PLL frequency synthesizer 35, and the frequency of this signal should be set at 100 MHz or lower.

Accordingly, if the frequency of the fixed oscillator 38 is determined to be 6 times the frequency (129.55 MHz) of the receiving second local oscillator 13, the frequency of the fixed oscillator 38 is 777.3 MHz, and the frequency of the PLL frequency synthesizer 35 is 829.7 to 841.7 MHz {(1,607–777.3) MHz to (1,619–777.3)} MHz.

In addition, from the relationship between the transmit frequency (1,429 to 1,441 MHz) and the frequency (829.7 to 841.7 MHz) of the PLL frequency synthesizer 35, the transmitting second local frequency is 599.3 MHz (1,429–829.7 MHz).

As will be understood from the above, the frequencies of the PLL frequency synthesizer 35 and the fixed oscillator 38 can be lowered to about ½ of those in the conventional radio system.

It should be noted that for other frequency bands, frequencies can also be obtained by calculation in the same way as the above.

Figure 3:
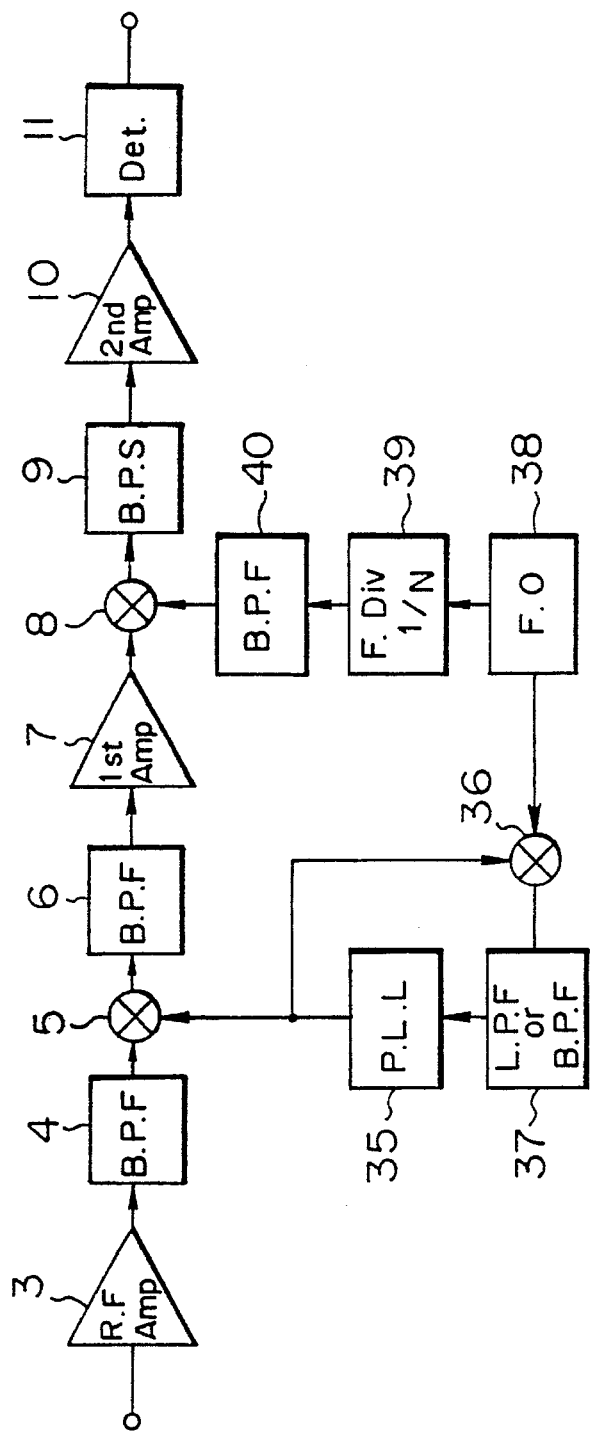
FIG. 3 is a block diagram showing one example of the arrangement on the receiver side of the radio system according to the present invention.

FIG. 3 is a block diagram showing one example of the arrangement of a receiver which is usable for the above-described radio system. The output of the PLL frequency synthesizer 35 is supplied to the mixer 5 and also to the mixer 36. In the mixer 36, the output of the PLL frequency synthesizer 35 is down-converted with an output from the fixed oscillator 38 and then fed back to the PLL frequency synthesizer 35 after undesired waves have been removed through the low-pass or band-pass filter 37 according to need.

Figure 4:
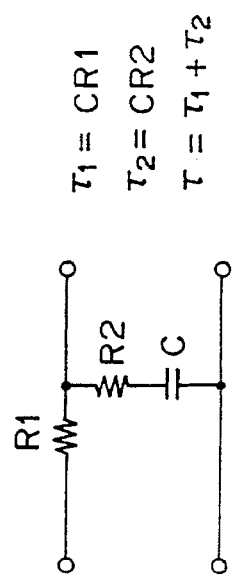
FIG. 4 is a circuit diagram showing one example of the arrangement of a PLL loop filter.

The lock-up speed of the PLL frequency synthesizer 35 increases as the natural frequency $\omega_n$ of the PLL becomes higher. When a lag-lead filter such as that shown in FIG. 4 is employed as a loop filter of the PLL, the natural frequency $\omega_n$ is given by $$\omega_n = (K/\tau \cdot n)^{1/2} \quad (1)$$

K: loop gain coefficient
N: frequency dividing ratio of programmable counter
Assuming that the reference frequency is $f_r$, the output frequency $f_o$ of the PLL frequency synthesizer 35 is given by $$f_o = N \cdot f_r \quad (2)$$

From the expressions (1) and (2), the natural frequency $\omega_n$ may be expressed by $$\omega_n = (K \cdot f_r / \tau \cdot f_o)^{1/2} \quad (3)$$

In the present invention, the output frequency $f_o$ is down-converted to a lower frequency, thereby increasing the natural frequency $\omega_n$, and thus increasing the lock-up speed.

On the other hand, the output of the fixed oscillator 38 is supplied to the mixer 36 and also to a frequency divider 39 where it is divided by N, and then supplied to the mixer 8 after undesired waves have been removed through a low-pass or band-pass filter 40 according to need. Therefore, it becomes unnecessary to provide a second local oscillator, which has heretofore been needed. Accordingly, it is possible to achieve a reduction in the size of the circuit and also a reduction in the power consumption.

The arrangement may also be such that the output frequency of the fixed oscillator 38 is divided in a predetermined ratio to use it as a frequency for the third or other subsequent local oscillator or as a frequency for a transmitter-side local oscillator, thereby eliminating the need for a local oscillator, which would otherwise be needed for each frequency converting stage, and thus achieving a reduction in the size of the circuit and also a reduction in the power consumption.

Although a receiver having two frequency converting stages is shown in FIG. 3 as an example, it should be noted that the number of frequency converting stages is not necessarily limited to two but may be three or more.

With the above-described receiver arrangement, the output frequency of the PLL frequency synthesizer 35 is down-converted to a lower frequency with the output frequency of the fixed oscillator 38, thereby increasing the natural frequency $\omega_n$ of the PLL. Thus, the lock-up speed can be increased.

Figure 5:
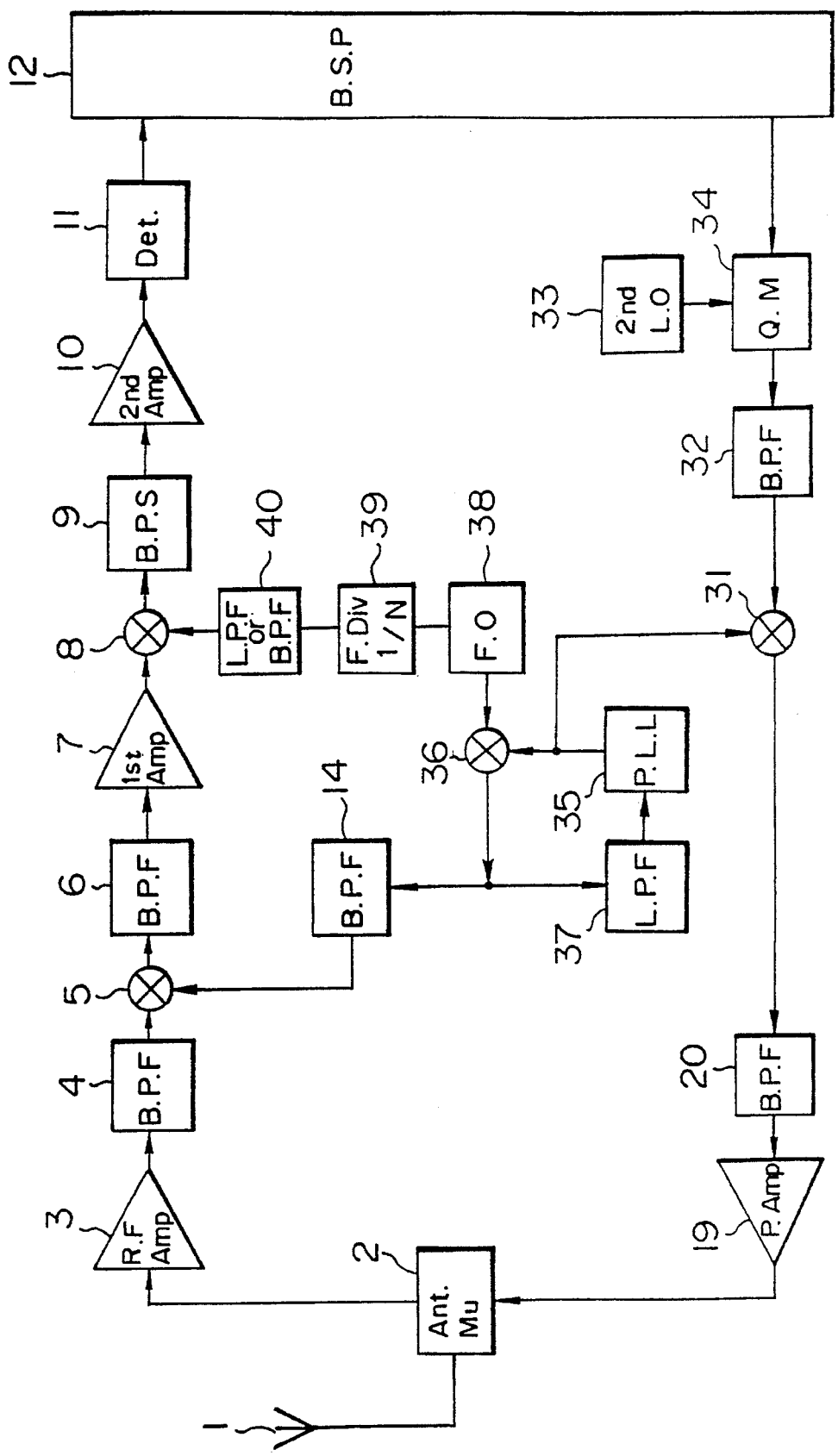
FIG. 5 is a block diagram showing another example of the arrangement of the radio system according to the present invention.

FIG. 5 is a block diagram showing one example in which the technique shown in FIG. 3 is applied to the radio system shown in FIG. 2. As shown in FIG. 5, the output frequency of the fixed oscillator 38 is divided by N in the frequency divider 39 and then supplied to the receiver-side mixer 8 after undesired waves have been removed through the low-pass or band-pass filter 40. Thus, it is possible to omit the receiving second local oscillator 13.

One example of preset frequencies for a 1.5 GHz-band digital automobile telephone that uses the radio system arranged as shown in FIG. 5 will be shown below.

The transmit frequency band of 1,429 to 1,441 MHz and the receive frequency band of 1,477 to 1,489 MHz will be taken by way of example for the following explanation.

Assuming that the first and second intermediate frequencies are 130 MHz and 450 KHz, respectively, the receiving first local frequency is 1,607 to 1,619 MHz. Accordingly, the PLL frequency synthesizer 35 and the fixed oscillator 38 should be arranged such that the sum of the frequency of the PLL frequency synthesizer 35 and the frequency of the fixed oscillator 38 falls in the range of 1,607 to 1,619 MHz.

The difference between the two frequencies is a signal that is fed back to the PLL frequency synthesizer 35, and the frequency of this signal should be set at 100 MHz or lower.

Accordingly, if the frequency of the fixed oscillator 38 is determined to be 6 times the frequency (129.55 MHz) supplied to the receiver-side mixer 8 (i.e., the frequency dividing ratio 1/N of the frequency divider 39=⅙), the frequency of the fixed oscillator 38 is 777.3 MHz, and the frequency of the PLL frequency synthesizer 35 is 829.7 to 841.7 MHz {(1,607–777.3) MHz to (1,619–777.3)} MHz .

In addition, from the relationship between the transmit frequency (1,429 to 1,441 MHz) and the frequency (829.7 to 841.7 MHz) of the PLL frequency synthesizer 35, the transmitting second local frequency is 599.3 MHz (1,429–829.7 MHz).

Figure 6:
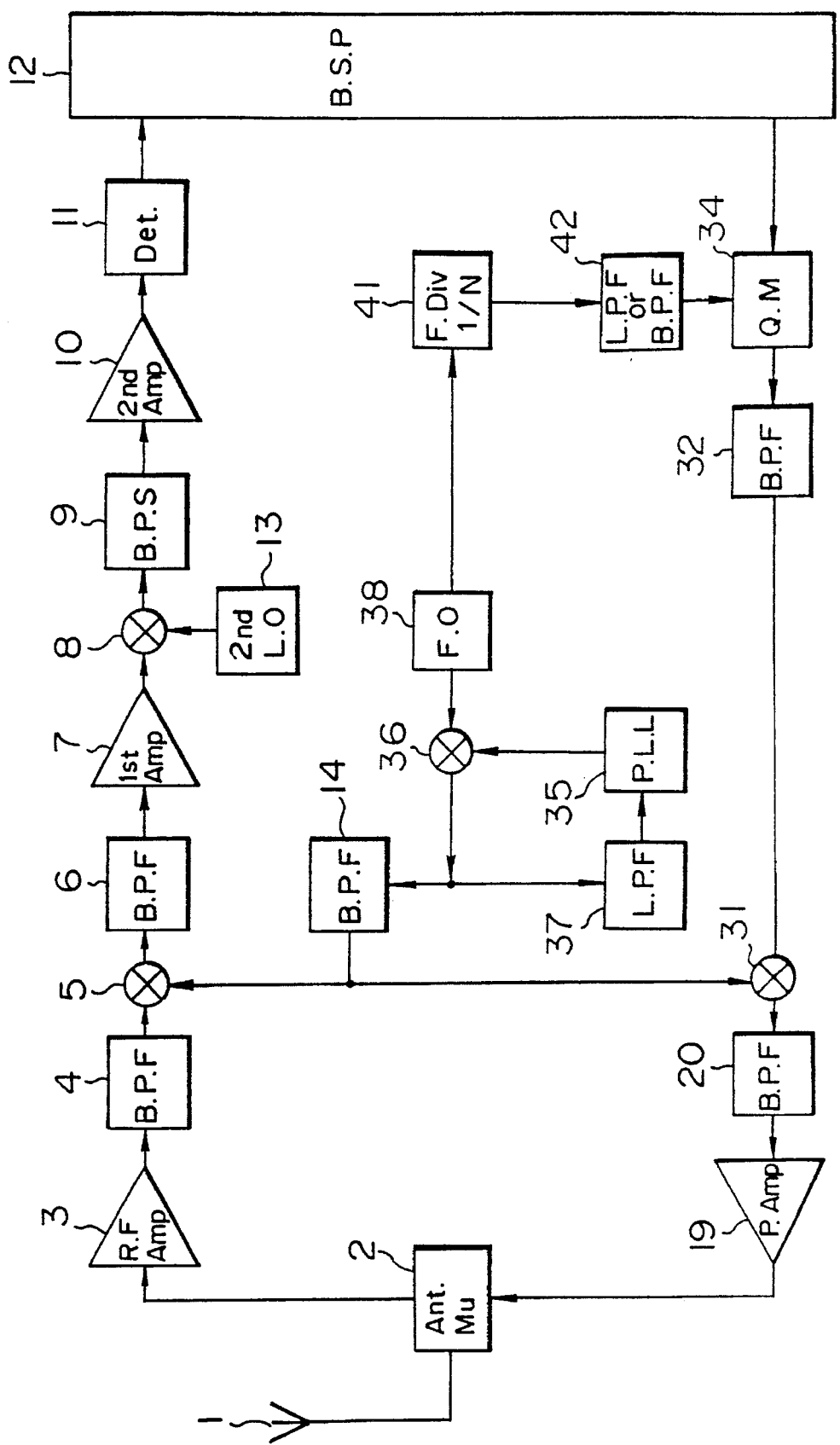
FIG. 6 is a block diagram showing still another example of the arrangement of the radio system according to the present invention.

FIG. 6 is a block diagram showing another example in which the technique shown in FIG. 3 is applied to the radio system shown in FIG. 2. As shown in FIG. 6, the output frequency of the fixed oscillator 38 is divided by N in a frequency divider 41 and then supplied to the quadrature modulator 34 as a transmitting second local frequency after undesired waves have been removed through a low-pass or band-pass filter 42. Thus, it is possible to omit the transmitting second local oscillator 33.

One example of preset frequencies for a 1.5 GHz-band digital automobile telephone that uses the radio system arranged as shown in FIG. 6 will be shown below.

The transmit frequency band of 1,429 to 1,441 MHz and the receive frequency band of 1,477 to 1,489 MHz will be taken by way of example for the following explanation.

Assuming that the first and second intermediate frequencies are 130 MHz and 450 KHz, respectively, the receiving first local frequency is 1,607 to 1,619 MHz. Accordingly, the PLL frequency synthesizer 35 and the fixed oscillator 38 should be arranged such that the sum of the frequency of the PLL frequency synthesizer 35 and the frequency of the fixed oscillator 38 falls in the range of 1,607 to 1,619 MHz.

The difference between the two frequencies is a signal that is fed back to the PLL frequency synthesizer 35, and the frequency of this signal should be set at 100 MHz or lower.

Accordingly, if the frequency of the fixed oscillator 38 is determined to be 4 times the frequency (178 MHz) supplied to the transmitter-side quadrature modulator 34 (i.e., the frequency dividing ratio 1/N of the frequency divider 39=¼), the frequency of the fixed oscillator 38 is 712 MHz, and the frequency of the PLL frequency synthesizer 35 is 895 to 907 MHz {(1,607−712) MHz to (1,619−712)} MHz.

The present invention may be carried out in various other forms without departing from the spirit and principal features thereof. Accordingly, the foregoing embodiments are merely illustrative examples and should not limitatively be construed.

The technical scope of the present invention is limited solely by the appended claims and by no means bound by the text of the specification.

Furthermore, all modifications and changes within the technical scope of the claims come within the scope of the present invention.

What we claim is:

1. A radio system comprising:

fixed frequency oscillator means for oscillating a fixed frequency signal and for generating at least a first output frequency, a PLL frequency synthesizer for generating at least a second output frequency, means for supplying the output frequency of the PLL frequency synthesizer to a transmitter side mixer as a transmitter local frequency, means for mixing the first output frequency and the second output frequency and for producing local frequencies including at least a sum frequency and a difference frequency, means for supplying the sum frequency to a receiver side mixer as a receiving first local frequency, and means for feeding back the difference frequency to the PLL frequency synthesizer, whereby the oscillator is used in common, thereby achieving a reduction in the size of the circuit, and whereby the output frequencies of the PLL frequency synthesizer and the fixed frequency oscillator means are lowered, thereby reducing power consumption, and whereby the input frequencies of the PLL frequency synthesizer means are lower than the output frequencies, thereby increasing frequency changing speed.

2. The system of 1, wherein the system defines a transmitter side and a receiver side, further comprising:

at least two frequency converting stages associated with the transmitter side, at least two frequency converting stages associated with the receiver side, and means for dividing the output frequency of the fixed frequency oscillator means according to a predetermined ratio and using the divided frequency as a local frequency for at least one of the frequency converting stages on at least one of the receiver or transmitter sides.

\* \* \* \* \*